United States Patent
Bai et al.

(10) Patent No.: US 9,247,650 B2
(45) Date of Patent: Jan. 26, 2016

(54) METHOD FOR MAKING CONDUCTIVE WIRES

(75) Inventors: Yao-Wen Bai, BeiJing (CN); Rui Zhang, BeiJing (CN); Cheng-Hsien Lin, Tu-Cheng (TW)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 1233 days.

(21) Appl. No.: 12/589,459

(22) Filed: Oct. 22, 2009

(65) Prior Publication Data

US 2010/0151120 A1 Jun. 17, 2010

(30) Foreign Application Priority Data

Dec. 12, 2008 (CN) .............................. 200810218193

(51) Int. Cl.
 *H05K 3/24* (2006.01)
 *C23C 18/18* (2006.01)
 *B82Y 10/00* (2011.01)
 *H05K 3/12* (2006.01)

(52) U.S. Cl.
 CPC ................ *H05K 3/246* (2013.01); *B82Y 10/00* (2013.01); *C23C 18/18* (2013.01); *H05K 3/125* (2013.01); *H05K 2201/026* (2013.01); *H05K 2201/0323* (2013.01); *H05K 2201/0347* (2013.01); *H05K 2203/013* (2013.01); *H05K 2203/072* (2013.01)

(58) Field of Classification Search
 CPC ............................... H05K 3/125; H05K 3/246
 USPC ....................................................... 427/98.5
 See application file for complete search history.

(56) References Cited

U.S. PATENT DOCUMENTS

| | | | | |
|---|---|---|---|---|
| 5,989,787 | A | * | 11/1999 | Kanoh et al. ................... 430/324 |
| 7,896,484 | B2 | * | 3/2011 | Hiroki et al. ................... 347/100 |
| 2006/0124028 | A1 | * | 6/2006 | Huang et al. ................ 106/31.92 |
| 2006/0130700 | A1 | | 6/2006 | Reinartz |
| 2006/0189113 | A1 | | 8/2006 | Vanheusden et al. |
| 2007/0056855 | A1 | * | 3/2007 | Lo et al. ........................... 205/76 |
| 2007/0292622 | A1 | * | 12/2007 | Rowley et al. ............. 427/407.1 |
| 2008/0206488 | A1 | * | 8/2008 | Chung et al. ................... 427/596 |
| 2008/0299307 | A1 | * | 12/2008 | Ward et al. ................. 427/249.1 |
| 2009/0008142 | A1 | | 1/2009 | Shimizu et al. |
| 2009/0068241 | A1 | * | 3/2009 | Britz et al. ..................... 424/409 |
| 2010/0098916 | A1 | * | 4/2010 | Miyake ....................... 428/195.1 |

FOREIGN PATENT DOCUMENTS

| | | |
|---|---|---|
| TW | 200711994 | 4/2007 |
| TW | 200800609 | 1/2008 |
| TW | I298520 | 7/2008 |

OTHER PUBLICATIONS

Oh et al. Silver-plated carbon nanotubes for silver/conducting polymer composites. Nanotechnology 19 (Nov. 19, 2008) 495602.*
Feng et al. "Electroless plating of carbon nanotubes with silver". Journal of Materials Science 39 (2004) pp. 3241-3243.*

(Continued)

*Primary Examiner* — Dah-Wei D Yuan
*Assistant Examiner* — Jose Hernandez-Diaz
(74) *Attorney, Agent, or Firm* — Novak Druce Connolly Bove + Quigg LLP

(57) ABSTRACT

A method for making conductive wires is provided. Firstly, an ink having carbon nanotubes is provided. Secondly, a baseline is formed using the ink on a substrate. Thirdly, the baseline is electroless plated.

4 Claims, 3 Drawing Sheets

(56) References Cited

OTHER PUBLICATIONS

Bin Xue et al., Growth of Pb, Pt, Ag and Au Nanoparticles on Carbon Nanotubes, J. Mater. Chem., vol. 11, p. 2378-2381, (2001).
Dan Wang et al., Templated Synthesis of Single-Walled Carbon Nanotube and Metal Nanoparticle Assemblies in Solution, J. Am. Chem. Soc., vol. 128, p. 15078-15079, (2006).
Wei-Tai wu, One-step functionalization of multi-walled carbon nanotubes with Ag/polymer under γ-ray irradiation, Nanotechnology,19, Feb. 21, 2008,UK.
Yuan et al., Electroless plating of carbon nanotube with copper, The Chinese Journal of Nonferrous Metals, p. 665-669, vol. 14, No. 4, 2004. The abstract may be relevant.

* cited by examiner

METHOD FOR MAKING CONDUCTIVE WIRES

RELATED APPLICATIONS

This application claims all benefits accruing under 35 U.S.C. §119 from China Patent Application No. 200810218193.2, filed on Dec. 12, 2008 in the China Intellectual Property Office, the disclosure of which is incorporated herein by reference. This application is related to commonly-assigned applications entitled, "INKJET INK AND METHOD FOR MAKING CONDUCTIVE WIRES USING THE SAME", filed on Oct. 22, 2009 with U.S. patent application Ser. No. 12/589,461 and "CARBON NANOTUBE METAL NANOPARTICLE COMPOSITE AND METHOD FOR MAKING THE SAME", filed on Oct. 22, 2009 with U.S. patent application Ser. No. 12/589,477.

BACKGROUND

1. Technical Field

The present disclosure relates to methods for making conductive wires and, particularly, to a method for making conductive wires based on carbon nanotubes.

2. Description of Related Art

Ink jet printing can be advantageous for making unique prints because, as a digital technology, images can be easily changed or varied. As the advancement of science and technology continues, ink jet printing may be used in the process of making an interconnection wire.

One method for making interconnection wires includes the following steps. Firstly, a dispersion of carbon nanotubes with carbon nanotubes dispersed in an organic solvent is prepared. Secondly, a baseline is printed with the dispersion on a surface of a substrate. Thirdly, the organic solvent is evaporated to obtain a conductive baseline. Finally, the surface of the conductive baseline is electroplated in an electroplating bath containing a metal ion, so that an interconnection wire, which is a composite of metal and carbon nanotubes, is formed.

However, the method for making interconnection wires by printing and electroplating has the following disadvantages. Firstly, a mass ratio of the carbon nanotubes in the dispersion solvent used in this method is large, usually above 10% to ensure formation of a conductive baseline for the electroplating. Such a large mass ratio means the carbon nanotubes cannot be dispersed in the solvent uniformly, resulting in a non-uniform thickness of the interconnection wires. Secondly, current density in the conductive baseline will be non-uniform during electroplating which further contributes to the non-uniform thickness of the interconnection wires.

What is needed, therefore, is to provide a method for making conductive wires having an improved uniformity of thickness.

BRIEF DESCRIPTION OF THE DRAWINGS

Many aspects of the present method for making conductive wires can be better understood with reference to the following drawings. The components in the drawings are not necessarily drawn to scale, the emphasis instead being placed upon clearly illustrating the principles of the present method for making conductive wires.

Figure 1:
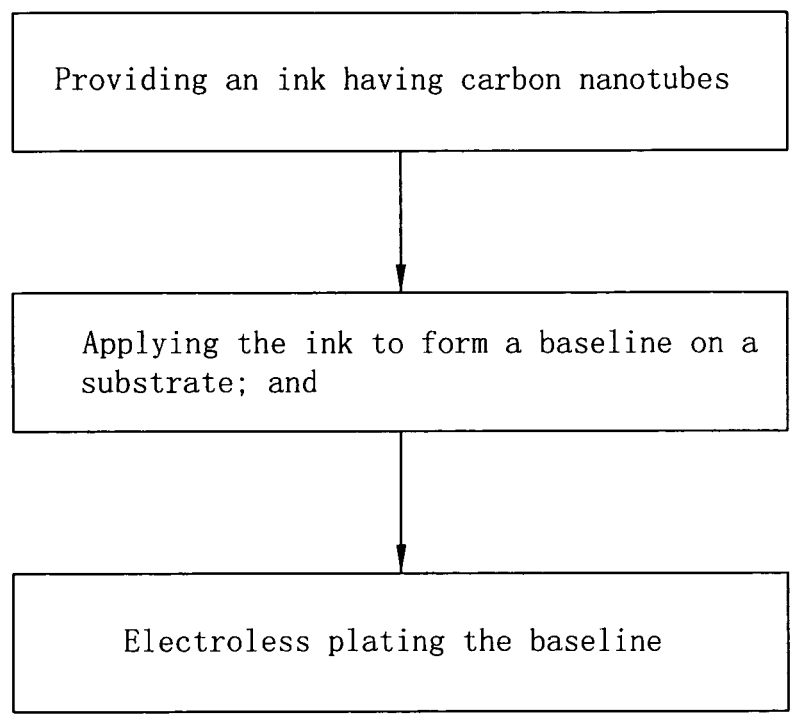
FIG. 1 is a flow chart of a method for making conductive wires, in accordance with one embodiment.

Corresponding reference characters indicate corresponding parts throughout the several views. The exemplifications set out herein illustrate at least one embodiment of the present method for making conductive wires, in at least one form, and such exemplifications are not to be construed as limiting the scope of the disclosure in any manner.

DETAILED DESCRIPTION

References will now be made to the drawings to describe, in detail, various embodiments of the present method for making conductive wires.

Figure 2:
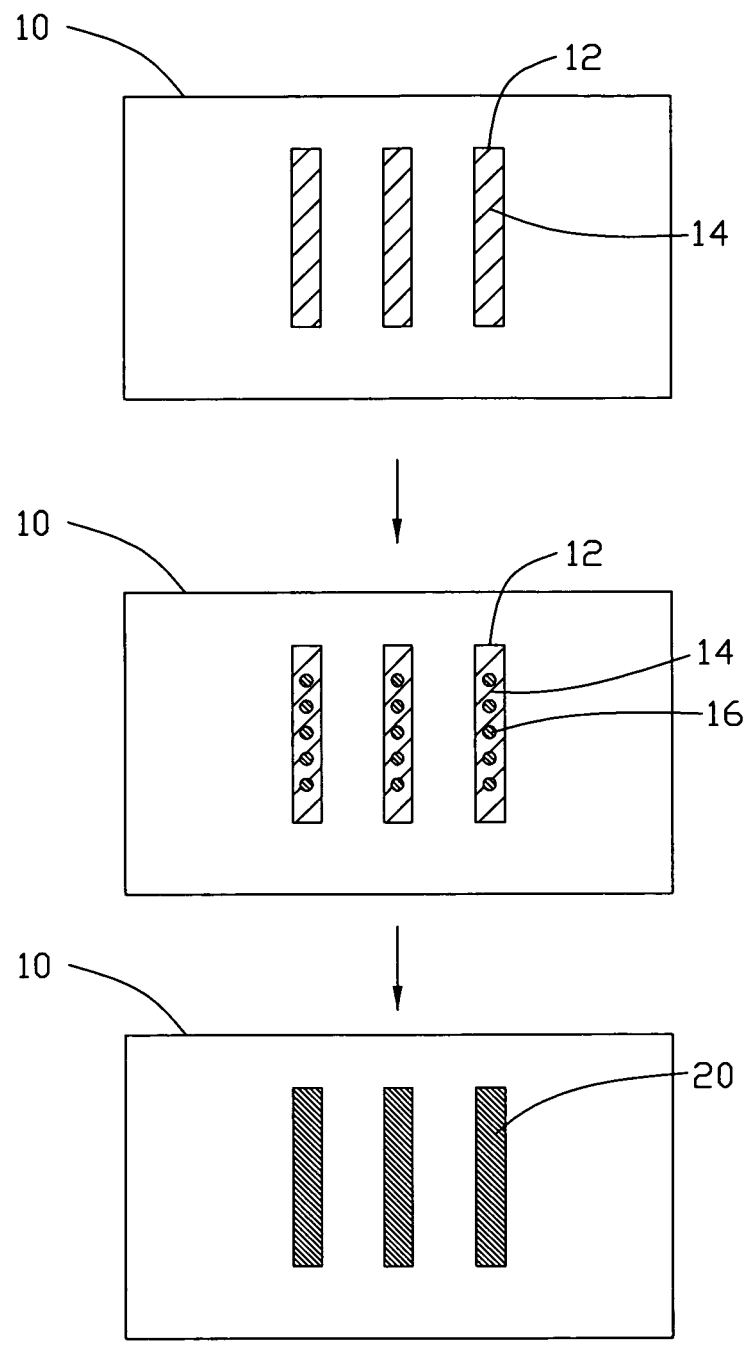
FIG. 2 is a schematic view of steps in the method for making conductive wires, in accordance with one embodiment.

Referring to FIGS. 1 and 2, a method for making conductive wires 20 according to one embodiment includes the following steps of: (a) providing an ink having carbon nanotubes 14; (b) forming a baseline 12 using the ink on a substrate 10; and (c) electroless plating the baseline 12 to obtain conductive wires 20.

In step (a), the ink can include a solvent of 50-80 wt %, carbon nanotubes 14 of 0.0001-5 wt %, a viscosity modifier of 0.1-30 wt %, a surfactant of 0.1-5 wt %, and a binder of 0.1-30 wt %.

The solvent can be water. In one embodiment, the solvent is de-ionized water. The carbon nanotubes 14 in the ink can be selected from a group consisting of single-walled carbon nanotubes, double-walled carbon nanotubes, multi-walled carbon nanotubes, and combinations thereof. A diameter of each carbon nanotube 14 can be less than about 50 nanometers. A length of the carbon nanotubes 14 can be less than about 2 micrometers. Furthermore, the carbon nanotubes 14 can have a plurality of functional groups formed on the walls and end portions thereof. The functional groups can be any hydrophilic group selected from a group consisting of carboxyl (—COOH), aldehyde group (—CHO), amino group (—NH$_2$), hydroxyl (—OH), and combinations thereof. The functional groups make the carbon nanotubes 14 soluble in the solvent. In one embodiment, a length of the carbon nanotubes 14 ranges from about 50 nanometers to about 200 nanometers and a ratio of the carbon nanotubes 14 ranges from about 1% to about 3% by weight. The viscosity modifier can be a material selected from a group consisting of methanol, ethanol, cellulose ethers, guar gum, silica gel, and combinations thereof. In one embodiment, the viscosity modifier is methanol. The surfactant can be selected from a group consisting of fatty acids, phosphate esters, sodium lauryl sulfates, isosorbide dinitrates, modified polyvinyl alcohols (PVA), and combinations thereof. The surfactant can help the carbon nanotubes 14 disperse uniformly in the ink. In one embodiment, the surfactant is modified PVA. The binder can be selected from a group consisting of polyvinyl pyrrolidones (PVP), polyvinyl alcohols (PVA), and combinations thereof. The binder can fix the carbon nanotubes 14 on a substrate after the solvent is evaporated. In one embodiment, the binder is PVP.

The ink may further include a moisturizing agent of 0.1-40 wt %. The moisturizing agent can be an agent with a high boiling point. The moisturizing agent can be selected from a group consisting of polypropylene glycols (PPG), glycol ethers, and combinations thereof. The moisturizing agent can raise the boiling point of the ink. The ink provided in one embodiment is not volatilizable at temperatures from about 50° C. to about 100° C. In one embodiment, the moisturizing agent is glycol ethers.

The ink can be made by the following substeps of: (a1) providing and purifying a plurality of carbon nanotubes 14; (a2) functionalizing the carbon nanotubes 14; (a3) dispersing the functionalized carbon nanotubes 14 in water; and (a4) adding a viscosity modifier, a surfactant, and a binder into the water to form a mixture; and (a5) agitating the mixture to obtain an ink.

In step (a1), the carbon nanotubes 14 can be obtained by a conventional method, such as chemical vapor deposition (CVD), arc discharging, or laser ablation. The carbon nanotubes 14 can be obtained by the substeps of: providing a substrate; forming a carbon nanotube array on the substrate by a chemical vapor depositing method; and peeling the carbon nanotube array off the substrate by a mechanical method, thereby achieving a plurality of carbon nanotubes 14. The carbon nanotubes 14 in the carbon nanotube array are substantially parallel to each other.

The carbon nanotubes 14 can be purified by the substeps of: heating the carbon nanotubes 14 in air flow at about 350° C. for about 2 hours to remove amorphous carbons; soaking the treated carbon nanotubes 14 in about 36% hydrochloric acid for about one day to remove metal catalysts; isolating the carbon nanotubes 14 soaked in the hydrochloric acid; rinsing the isolated carbon nanotubes 14 with de-ionized water; and filtrating the carbon nanotubes 14.

Figure 3:
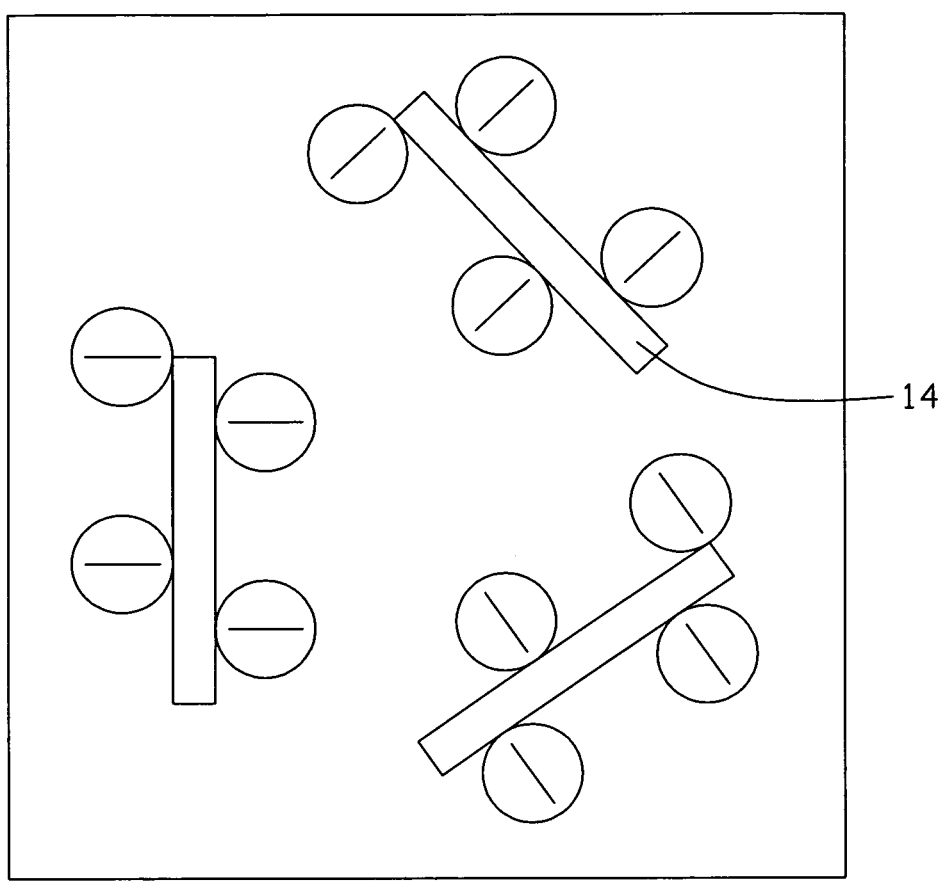
FIG. 3 is a schematic view of functionalized carbon nanotubes, in accordance with one embodiment.

In step (a2), the carbon nanotubes 14 can be treated by an acid with the substeps of: refluxing the carbon nanotubes 14 in nitric acid at about 130° C. for a period of time from about 4 hours to about 48 hours to form a suspension; centrifuging the suspension to form an acid solution and carbon nanotube sediment; and rinsing the carbon nanotube sediment with water until the pH of the used water is about 7. Referring to FIG. 3, the carbon nanotubes 14 can be chemically modified with functional groups such as —COOH, —CHO, —$NH_2$ and —OH on the walls and end portions thereof after the acid treatment. These functional groups can help carbon nanotubes 14 to be soluble and dispersible in the solvent.

In step (a3), the functionalized carbon nanotubes 14 can be treated by the substeps of: filtrating the carbon nanotubes 14; putting the carbon nanotubes 14 into a de-ionized water to obtain a mixture; ultrasonic stirring the mixture; and centrifuging the mixture. The above steps can be repeated about 4 to 5 times to obtain a solution of carbon nanotubes 14 and de-ionized water.

In step (a4), the mixture of de-ionized water, carbon nanotubes 14, viscosity modifier, surfactant, and binder can be agitated mechanically for about 20 minutes to about 50 minutes at room temperature to obtain an ink. The ink can be sealed in an ink box. A moisturizing agent can be added in the mixture in step (a4).

In step (b), the substrate 10 can be made of insulative material selected from a group consisting of silicon, silicon oxide, quartz, sapphire, ceramic, glass, metal oxide, organic polymer, textile fabric, and combinations thereof. A shape and a size of the substrate 10 are arbitrary, and can be chosen according to need. The method of forming a baseline 12 using the ink on the substrate 10 can be by printing using an ink jet printer. In one embodiment, the substrate 10 is a polyimide laminate and the ink jet printer is an Epson R230. The ink jet print head will not get clogged because a length of the carbon nanotubes 14 is less than 200 nanometers and the ratio of a carbon nanotubes 14 in the ink is less than or equal to 5% by weight. A pattern can be formed by a plurality of baselines 12 according to need. The baseline 12 includes the plurality of carbon nanotubes 14 uniformly dispersed therein.

Step (c) includes the following substeps of (c1) drying the baseline 12; (c2) activating the baseline 12; and (c3) applying an electroless plating solution on the baseline 12.

Step (c1) can be executed by oven drying or sunlight drying. In one embodiment, the substrate 10 is kept in an oven for about 10 seconds to about 60 seconds at a temperature ranging from about 120° C. to about 150° C. The carbon nanotubes 14 in the baseline 12 can be fixed on the substrate 10 more stably by step (c1).

Step (c2) can be carried out by dipping the entire substrate 10 in a solution of metal-salt or applying a solution of metal salt to the baseline 12 so as to soak the entire surface of the baseline 12. The metal-salt can be selected from a group consisting of a salt of silver, salt of palladium, and combinations thereof. For example, the metal-salt can be selected from a group consisting of silver nitrate ($AgNO_3$), palladium nitrate ($PdCl_2$), and combinations thereof. The solution of metal-salt includes a plurality of metal ions uniformly dispersed therein. In step (c2), the carbon nanotubes 14 in the baseline 12 can adsorb a plurality of metal ions 16 due to the large specific surface area of the carbon nanotubes 14. The metal ions 16 adsorbed on the carbon nanotubes 14 form a plurality of catalytic centers to allow for electroless plating in the following step. In one embodiment, the entire substrate 10 is dipped in a solution of $AgNO_3$ for about 10 to about 200 seconds. A concentration of the $AgNO_3$ in the solution can be greater than $10^{-4}$ mol/L.

An optional step (c4) of rinsing the baseline 12 can be carried out after step (c2).

In step (c3), the entire substrate 10 can be put into an electroless plating solution to apply a metal layer coating on the baseline 12. The electroless plating solution can be a nickel electroless plating solution or a copper electroless plating solution. In one embodiment, the electroless plating solution includes 5-15 g/L of copper sulphate, 10-20 mL/L of formaldehyde, 40-60 g/L of ethylene diamine tetraacetic acid (EDTA), 15-30 g/L of potassium sodium tartrate. The baseline 12 can be immersed in the copper electroless plating solution for about 2 minutes at a temperature of about 50° C.

The carbon nanotubes 14 can uniformly disperse in the ink because the ratio of the carbon nanotubes 14 in the ink is less than or equal to 5% by weight and the carbon nanotubes 14 have a plurality of functional groups formed on the walls and end portions thereof. Accordingly, the thickness of the conductive wires 20 made by the electroless plating is uniform. In addition, the efficiency of electroless plating is increased because the carbon nanotubes 14 in the baseline 12 have a large specific surface area and adsorb a plurality of metal ions 16 thereon.

A step (d) of electroplating the conductive wires 20 can be carried out after step (c) to increase the thickness of the conductive wires 20. In one embodiment, the conductive wires 20 are put into a copper electroplating bath for about 5 minutes to about 10 minutes to form a copper layer thereon. The thickness of copper layer can range from about 10 micrometers to about 100 micrometers.

It is to be understood that the above description and the claims drawn to a method may include some indication in reference to certain steps. However, the indication used is only to be viewed for identification purposes and not as a suggestion as to an order for the steps.

Finally, it is also to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for making conductive wires, the method comprising the following steps of:
   (a) providing an ink having carbon nanotubes, wherein the ink comprises a solvent of 50-80 wt %, carbon nanotubes of 0.0001-5 wt %, a viscosity modifier of 0.1-30 wt %, a surfactant of 0.1-5 wt %, a binder of 0.1-30 wt % and a moisturizing agent; and the moisturizing agent is selected from the group consisting of polypropylene glycols and glycol ethers so that the ink is not volatilizable at temperatures in a range from about 50° C. to about 100° C.;
   (b) applying the ink to form a baseline on a substrate; and
   (c) electroless plating the baseline to apply a metal layer coating on the baseline having a plurality of the carbon nanotubes therein.

2. A method for making conductive wires, the method comprising following steps:
   providing an ink comprising a solvent of 50-80 wt %, carbon nanotubes of 0.0001-5 wt %, a viscosity modifier of 0.1-30 wt %, a surfactant of 0.1-5 wt %, a binder of 0.1-30 wt %, and a moisturizing agent of 0.1%-40 wt %, wherein the moisturizing agent is selected from the group consisting of polypropylene glycols and glycol ethers;
   applying the ink to form a baseline on a substrate by ink jet printing; and
   electroless plating the baseline to apply a metal layer coating on the baseline having a plurality of the carbon nanotubes therein.

3. The method of claim 2, wherein lengths of the carbon nanotubes are in a range from about 50 nanometers to about 200 nanometers, the carbon nanotubes in the ink is less than or equal to 5% by weight.

4. The method of claim 3, wherein the carbon nanotubes in the ink is in a range from about 1% to about 3% by weight.

* * * * *